(12) United States Patent
Houlihan et al.

(10) Patent No.: US 6,258,673 B1
(45) Date of Patent: Jul. 10, 2001

(54) MULTIPLE THICKNESS OF GATE OXIDE

(75) Inventors: Kevin M. Houlihan, Wappingers Falls; Liang-Kai Han, Fishkill, both of NY (US); Dale W. Martin, Hyde Park, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/470,460

(22) Filed: Dec. 22, 1999

(51) Int. Cl.[7] .................................................. H01L 21/8234
(52) U.S. Cl. ..................... 438/275; 438/199; 438/216; 438/238; 438/770; 438/775; 438/981
(58) Field of Search ..................................... 438/199, 216, 438/238, 275, 287, 769, 770, 775, 981, FOR 216, FOR 489, FOR 490

(56) References Cited

U.S. PATENT DOCUMENTS

| | | | |
|---|---|---|---|
| 5,576,226 | * 11/1996 | Hwang | 438/275 |
| 5,918,116 | * 6/1999 | Chittipeddi | 438/199 |
| 5,920,779 | * 6/1999 | Sun et al. | 438/275 |
| 6,091,109 | * 7/2000 | Hasegawa | 257/339 |
| 6,110,842 | * 8/2000 | Okuno et al. | 438/776 |
| 6,133,164 | * 10/2000 | Kim | 438/275 |

* cited by examiner

Primary Examiner—Matthew Smith
Assistant Examiner—Craig P. Lytle
(74) Attorney, Agent, or Firm—Eric W. Petraske

(57) ABSTRACT

A method of forming an integrated circuit having four thicknesses of gate oxide in four sets of active areas by: oxidizing the silicon substrate to form an initial oxide having a thickness appropriate for a desired threshold voltage transistor; depositing a blocking mask to leave a first and fourth set of active areas exposed; implanting the first and fourth set of active areas with a dose of growth-altering ions, thereby making the first set of active areas more or less resistant to oxidation and simultaneously making the fourth set of active areas susceptible to accelerated oxidation; stripping the blocking mask; forming a second blocking mask to leave the first and second sets of active areas exposed; stripping the initial oxide in exposed active areas; stripping the second blocking mask; surface cleaning the wafer; and oxidizing the substrate in a second oxidation step such that a standard oxide thickness is formed in the second set of active areas, whereby an oxide thickness of more or less than the standard oxide thickness is formed in the first set of active areas, an oxide thickness of greater than the standard oxide thickness is formed in the third set of active areas, and a fourth oxide thickness greater than the third oxide thickness is formed in the fourth set of active areas.

30 Claims, 1 Drawing Sheet

MULTIPLE THICKNESS OF GATE OXIDE

FIELD OF THE INVENTION

The field of the invention is CMOS integrated circuit processing, in particular processing to produce several thicknesses of gate oxide.

BACKGROUND OF THE INVENTION

Circuit designers often require transistors with different characteristics e.g. high performance, low leakage and/or multiple resistances to high voltage. These different characteristics can be achieved with different gate dielectric film properties and/or thicknesses.

The most common method of forming several thicknesses of gate oxide on the same chip is resist on oxide. However, this method becomes inappropriate when applied to form more than the standard "dual gate" devices.

For example, if a designer wants three gate oxide thicknesses, a standard resist on oxide approach would require 2 intermediate HF etches, 3 oxidations and 2 block level masks. This approach is not only expensive but also forms edge "divots" and planar recess in shallow trench isolation (STI) areas as a consequence of additional oxide etching.

Another method of forming several thicknesses of gate oxide on the same chip is by using nitrogen implantation. The disadvantage of this approach is that the gate thickness differences are dependent on nitrogen implant dose. It is known that too high nitrogen implant dosages degrade gate oxide reliability. Therefore, there is a limitation on gate oxide thickness options for various combinations of devices.

SUMMARY OF THE INVENTION

The invention relates to a method for forming three or four gate thicknesses with only two block level masks.

A feature of the invention is the implantation of ions through the blanket oxide film, which will become the gate interfacial layer of one or more gate dielectric devices.

Another feature of the invention is the implantation of ions in the surface of areas that will have increased and reduced voltage resistance, so that the ion implantation simultaneously accelerates oxide growth in one area and retards oxygen growth in the other area, respectively.

Yet another feature of the invention is the implantation of oxide growth-altering ions through the base oxide in the area that will have non-standard gate oxides while the areas of non-implanted surfaces are protected by a blocking mask; followed by another block mask, stripping the base oxide and growing a new oxide.

Yet another feature of the invention is the implantation of oxide-retarding ions in an area that is to have a thinner than normal gate oxide.

Yet another feature of the invention is the implantation of oxide-promoting ions in an area that is to have an intermediate gate oxide thickness.

Yet another feature of the invention is the use of a blanket ion implant between masks.

Yet another feature of the invention is the implantation of two or more growth altering species in the same area to produce desired dielectric film properties.

These features of the invention result in reduced process steps and complexity compared to prior art methods.

DESCRIPTION OF THE PREFERRED EMBODIMENT

A first embodiment of the invention is illustrated in the Figures by discussing only the three sections on the right (100, 200 and 300).

Figure 4:
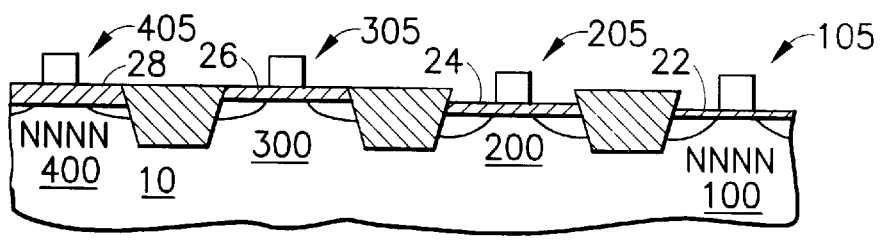

Referring to FIG. 4, there is shown schematically three transistors (105, 205 and 305) formed on corresponding active areas 100, 200 and 300 that each represent a set of transistors having different properties.

Transistor set 105 has a thin gate oxide 22, nominally 1.7 nm thick that is suited for high performance operation. Transistor set 205 has a slightly thicker gate oxide 24, nominally 2.2 nm thick, that is suited for both high performance operation and low leakage requirement applications. Lastly, transistor set 305 has a thicker gate oxide 26, nominally 5.0 nm thick that is suited for Input/Output or Analog applications.

These three gate oxides have been produced using two block-out masks and a single HF dip, in contrast to the resist on oxide prior art method cited above.

Figure 1:
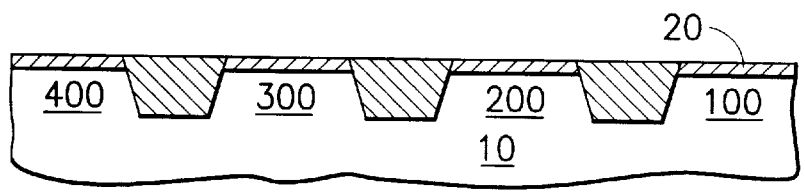
FIGS. 1 through 4 represent various stages in a method according to the invention.

Referring now to FIG. 1, there is shown the same area at an early stage in the process. Substrate 10 has been prepared (including conventional steps such as threshold adjustment, well implantation, etc.). Blanket oxide 20, nominally 4.8 nm thick has been formed above the three areas 100, 200 and 300 that represent the three types of active areas that will contain the three sets of transistors 105, 205 and 305.

Figure 2:
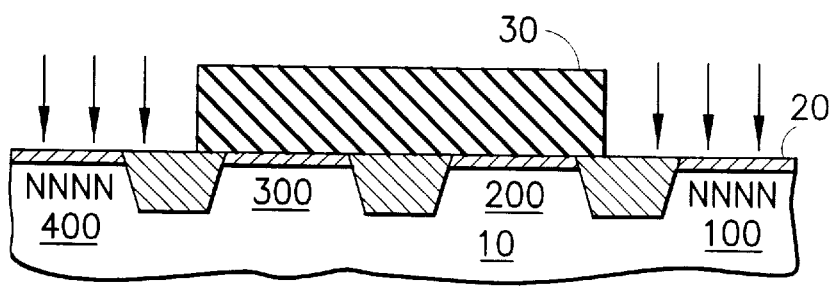

Next, in FIG. 2, a blockout mask 30 has been put down over areas 200 and 300 and area 100 has been implanted with nitrogen ions, illustratively a dose of $1 \times 10^{15}/cm^2$ at a voltage of 5 keV. It has been observed that implanted nitrogen slows the oxidation process (starting from unoxidized silicon), so that this area will have a thinner thickness of oxide in the second oxidation to follow than unimplanted areas.

Ions that have the effect of retarding the growth of oxide in unoxidized silicon include nitrogen. Ions that have the effect of promoting the growth of oxide include fluorine, chlorine and oxygen. The two types of ions are referred to collectively as growth-altering ions.

Figure 3:
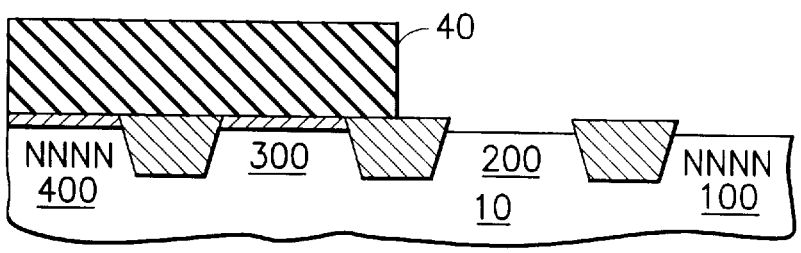

Next, the implanted resist is stripped, illustratively by an ozone gas chemistry. Oxide 20 protects the silicon surface during this strip. After the resist strip, a new blockout mask 40 is put down over area 300 and the portion of oxide 20 outside mask 40 is removed in a conventional HF dip. The result is shown in FIG. 3.

After resist 40 has been stripped, the wafer is thermally oxidized such that area 200 has an oxide thickness of 2.2 nm, appropriate for low-leakage transistors. Because of the implanted nitrogen, the oxide over area 100 grows more slowly, reaching a thickness of only 1.7 nm. In area 300, the new oxide grows through the old oxide 20 to a total depth of 5.0 nm, which is suited for I/O or analog transistors, which are exposed to higher voltages than internal transistors.

Those skilled in the art will appreciate that some variation of thicknesses is possible. The initial thickness, the dose of nitrogen, and the thickness of the oxide grown over area 200 are three parameters that can be changed. A thicker or thinner blanket oxide thickness can be used. Thus, with a permitted thickness range for oxide 20 on areas 100, 200 and 300 of between 3 nm and 7 nm, the thickness on area 300 can range from 3.5 nm to 8 nm. Illustratively, in the case of a nitrogen implant, for a thickness of 2.2 nm over area 200, the thickness over area 100 can range from 1.7 nm to 2.2 nm, corresponding to a dose range from $1\times10^{15}/cm^2$ to zero and initial oxide 20 thickness of 5 nm.

The magnitude of the initial oxide may range from about 0.5 nm to about 20 nm and the magnitude of the dose may range from $1\times10^{13}/cm^2$ to $1\times10^{16}/cm^2$ and the implant voltage may range from 2 keV to 200 keV, depending on the desired thickness, whether the implant is through oxide and the species of ion.

Alternatively, a growth-promoting ion could be implanted in area 100 and 200 after resist 40 is deposited, producing a thicker oxide in area 200 and an intermediate thickness in area 100.

For example, the growth-promoting ion could be local to area 100, or it could be a blanket implant performed before FIG. 1 or between FIGS. 2 and 3. Additionally, both growth promoting and growth retarding ions could be implanted in the same location. Illustratively, both nitrogen and oxygen ions could be implanted in area 100 to produce $SiO_xN_y$ (referred to as "oxy-nitride") during the anneal step, with x and y being chosen by the designer to meet his requirements.

The foregoing has been described in the context of a CMOS logic process having a nominal groundrule of 130 nm gate length. Those skilled in the art will readily be able to adapt the teaching herein to their own needs.

An example of a circuit employing the invention is a logic circuit having an embedded SRAM array and Input/Output circuits. The logic circuitry will have the thin gate oxide for high performance; the SRAM array transistors will have the intermediate thickness for low leakage and the I/O transistors will have the thickest oxide for resistance to excess voltages.

A second embodiment of the invention produces four different thicknesses of gate oxide with the same two blockout masks.

Referring again to FIG. 4, there is shown schematically four transistors (105, 205, 305 and 405) formed on corresponding active areas 100, 200, 300 and 400 that each represent a set of transistors having different properties.

Transistor set 105 has a thin gate oxide 22, nominally 1.7 nm thick that is suited for high performance operation. Transistor set 205 has a slightly thicker gate oxide 24, nominally 2.2 nm thick that is suited for both high performance and low leakage requirement applications. Transistor set 305 has a thicker gate oxide 26, nominally 5.0 nm thick that is suited for Input/Output applications and transistor set 405 has an even thicker gate oxide that is suited for more strenuous Input/Output applications.

These four gate oxides have been produced using two blockout masks and a single HF dip, in contrast to the prior art method cited above.

Referring now to FIG. 1, there is shown the same area at an early stage in the process. Substrate 10 has been prepared (including conventional steps such as threshold adjustment, well implantation, etc.). Blanket oxide 20, nominally 4.8 nm thick has been formed above the four areas 100, 200, 300 and 400 that represent the four types of active areas that will contain the four sets of transistors 105, 205, 305 and 405.

Next, in FIG. 2, a blockout mask 30 has been put down over areas 200 and 300 and both areas 100 and 400 have been implanted with nitrogen ions, illustratively a dose of $1\times10^{15}/cm^2$ at a voltage of 5 kev.

It has been observed that implanting silicon surfaces with nitrogen slows the oxidation process when grown on unoxidized silicon, so that area 100 will have a thinner thickness of oxide in the second oxidation to follow than unimplanted areas. Surprisingly, it has also been observed that implanted oxide, in area 400, will grow faster in a second oxidation step. Thus, nitrogen implantation both retards and accelerates a subsequent oxidation, depending on whether the material being oxidized is bare silicon or is "damaged" oxide.

Ions that have the effect of retarding the growth of oxide include nitrogen. Ions that have the effect of promoting the growth of oxide include fluorine, chlorine and oxygen The two types of ions are referred to collectively as growth-altering ions.

Block level implanted photoresist 30 is then stripped, illustratively by an ozone gas chemistry. Oxide 20 protects the silicon surface during this strip. After the resist strip, a new blockout mask 40 is put down over areas 300 and 400 and the portion of oxide 20 outside mask 40 is removed in a conventional HF dip. The result is shown in FIG. 3.

After resist 40 has been stripped, the wafer is thermally oxidized such that area 200 has an oxide thickness of 2.2 nm, appropriate for low-leakage transistors. Because of the implanted nitrogen, the oxide over area 100 grows more slowly, reaching a thickness of only 1.7 nm. Also because of nitrogen implantation, the oxide over area 400 grows more rapidly than the oxide over area 300. In area 300, the new oxide grows through the old oxide 20 to a total depth of 5.0 nm, which is suited for I/O transistors, which are exposed to higher voltages than internal transistors. in area 400, the oxide grows to a thicker depth of about 5.3 nm.

Those skilled in the art will appreciate that some variation of thicknesses is possible. The initial thickness, the dose of nitrogen, and the thickness of the oxide grown over area 200 are three parameters that can be changed. For a given area 200 thickness, a thicker or thinner blanket oxide thickness can be used.

In addition, the implanted ion species could be oxide growth-promoting, such as oxygen, chlorine or fluorine. In that case, area 200 would have the thinnest oxide and area 100 would be somewhat thicker. Growth-retarding and growth-promoting ions will be referred to generally for purposes of the claims as "growth-altering".

Illustratively, for nitrogen implantation, an initial blanket oxide 20 depth of 5 nm, and for a thickness of 2.2 nm over area 200, the thickness over area 100 can range from 1.7 nm to 2.2 nm, corresponding to a dose range from $1\times10^{15}$ to zero.

Thus, with a permitted thickness range of between 1.5 nm and 7 nm on area 200, the thickness on area 300 can range from 5 nm to 8.5 nm. For a nominal nitrogen dose of $1\times10^{15}/cm^2$, the thickness over area 400 will be 1.06 times the thickness in area 300. For the same dose and thickness over area 200, the thickness on area 100 can range from 1.0 nm to 6.5 nm.

The magnitude of the initial oxide may range from about 0.0 nm to about 20 nm and the magnitude of the dose may range from $1\times10^{13}/cm^2$ to $1\times10^{16}/cm^2$ and the implant voltage may range from 2 keV to 200 keV, depending on the desired thickness, whether the implant is through oxide and the species of ion.

Alternatively, if the design does not require four oxide thicknesses, the implantation of area 100 could be eliminated (by covering it with the blocking resist 30) and three thicknesses could be obtained by implanting area 400.

As another alternative, area 300 could be eliminated and the implantation of area 100 retained, also resulting in three thicknesses of different values from the preceding alternative.

In addition, area 400 could be implanted with a growth-promoting species such as oxygen, chlorine or fluorine to produce a thicker oxide in area 400. This could be done in a four-thickness or a three-thickness approach. As yet another alternative, a growth-promoting ion could be implanted in area 100 and 200 after resist 40 is deposited, producing a thicker oxide in area 200 and an intermediate thickness in area 100. This also could be done in a three or four thickness approach.

Those skilled in the art will readily appreciate that the method described above can be varied to suit individual requirements. For example, area 300 could be eliminated if the I/O requirements on all pins required the thick oxide of area 400.

The uses specified for the various types of transistors are illustrative, and those skilled in the art will readily be able to adapt the various forms of the invention to their needs.

While the invention has been described in terms of a single preferred embodiment, those skilled in the art will recognize that the invention can be practiced in various versions within the spirit and scope of the following claims.

We claim:

1. A method of forming an integrated circuit having a first, second and third set of active areas comprising the steps of:
   preparing a silicon substrate;
   oxidizing said silicon substrate to form a first oxide having a first thickness;
   depositing a first blocking mask to leave said first set of active areas exposed;
   implanting said first set of active areas with a dose of growth-altering ions, whereby the thermal oxide growth rate in said first set of active areas is altered;
   stripping said first blocking mask;
   forming a second blocking mask to leave said first set of active areas and said second set of active areas exposed;
   stripping said first oxide in said first and second set of active areas;
   stripping said second blocking mask;
   oxidizing said substrate in a second oxidation step such that a standard oxide thickness is formed in said second set of active areas, whereby a first oxide thickness different from said standard oxide thickness is formed in said first set of active areas, and a third oxide thickness of greater than said standard oxide thickness is formed in said third set of active areas.

2. A method according to claim 1, in which said growth altering ions are growth retarding ions and said different oxide thickness different from said standard oxide thickness is less than said standard oxide thickness.

3. A method according to claim 1, in which said standard oxide thickness is in the range from about 1 nm to about 10 nm.

4. A method according to claim 1, in which said first oxide thickness is in the range from about 2 nm to about 20 nm.

5. A method according to claim 1, in which said ion implant dose is in the range from about $1\times10^{13}/cm^2$ to about $1\times10^{16}/cm^2$ at a voltage from about 2 keV to about 200 keV.

6. A method according to claim 2, in which said first oxide thickness is in the range from about 2 nm to about 20 nm.

7. A method according to claim 2, in which said ion implant dose is in the range from about $1\times10^{13}/cm^2$ to about $1\times10^{16}/cm^2$ at a voltage from about 2 keV to about 200 keV.

8. A method according to claim 3, in which said ion implant dose is in the range from about $1\times10^{13}/cm^2$ to about $1\times10^{16}/cm^2$ at a voltage from about 2 keV to about 200 keV.

9. A method according to claim 1, in which said growth altering ions are growth promoting ions and said different oxide thickness different from said standard oxide thickness is greater than said standard oxide thickness.

10. A method according to claim 1, further including a step of implanting a dose of growth-promoting ions in at least one of said set of active areas.

11. A method according to claim 10, in which said step of implanting a dose of growth-promoting ions is performed after said step of forming said second blocking mask.

12. A method according to claim 10, in which said step of implanting a dose of growth-promoting ions is a blanket implant.

13. A method according to claim 1, in which said step of implanting said first set of active areas includes implanting both growth promoting ions and growth retarding ions.

14. A method according to claim 13, in which said step of implanting said first set of active areas includes implanting both nitrogen and oxygen.

15. A method according to claim 14, in which said step of implanting said first set of active areas includes implanting both nitrogen and oxygen in a ration to produce oxy-nitride.

16. A method of forming an integrated circuit having first, second, third and fourth sets of active areas comprising the steps of:
   preparing a silicon substrate;
   oxidizing said silicon substrate to form a first oxide having a first thickness;
   depositing a first blocking mask to leave said first and said fourth sets of active areas exposed;
   implanting said first and fourth sets of active areas with a dose of growth-altering ions, whereby said first and fourth sets of active areas have altered oxide growth rates;
   stripping said first blocking mask;
   forming a second blocking mask to leave said first set of active areas and said second set of active areas exposed;
   stripping said first oxide in said first and second set of active areas;
   stripping said second blocking mask;
   oxidizing said substrate in a second oxidation step such that a standard oxide thickness is formed in said second set of active areas, whereby a different oxide thickness different from said standard oxide thickness is formed in said first set of active areas, an oxide thickness of greater than said standard oxide thickness is formed in said third set of active areas and an oxide thickness of greater than said third oxide thickness is formed in said fourth set of active areas.

17. A method according to claim 16, in which said growth altering ions are growth retarding ions and said different oxide thickness different from said standard oxide thickness is less than said standard oxide thickness.

18. A method according to claim 17, in which said standard oxide thickness is in the range from about 1 nm to about 10 nm.

19. A method according to claim 17, in which said first oxide thickness is in the range from about 0 nm to about 20 nm.

20. A method according to claim 17, in which said ion implant dose is in the range from about $1\times10^{13}/cm^2$ to about $1\times10^{16}/cm^2$ at a voltage from about 2 kev to about 200 kev.

21. A method according to claim 18, in which said first oxide thickness is in the range from about 0 nm to about 20 nm.

22. A method according to claim 18, in which said ion implant dose is in the range from about $1 \times 10^{13}/cm^2$ to about $1 \times 10^{16}/cm^2$ at a voltage from about 2 kev to about 200 kev.

23. A method according to claim 19, in which said ion implant dose is in the range from about $1 \times 10^{13}/cm^2$ to about $1 \times 10^{16}/cm^2$ at a voltage from about 2 kev to about 200 kev.

24. A method according to claim 16, in which said growth altering ions are growth promoting ions and said different oxide thickness different from said standard oxide thickness is greater than said standard oxide thickness.

25. A method according to claim 16, further including a step of implanting a dose of growth-promoting ions in at least one of said set of active areas.

26. A method according to claim 25, in which said step of implanting a dose of growth-promoting ions is performed after said step of forming said second blocking mask.

27. A method according to claim 26, in which said step of implanting a dose of growth-promoting ions is a blanket implant.

28. A method according to claim 16, in which said step of implanting said first set of active areas includes implanting both growth promoting ions and growth retarding ions.

29. A method according to claim 28, in which said step of implanting said first set of active areas includes implanting both nitrogen and oxygen.

30. A method according to claim 29, in which said step of implanting said first set of active areas includes implanting both nitrogen and oxygen in a ration to produce oxy-nitride.

* * * * *